(12) United States Patent
Kim et al.

(10) Patent No.: US 10,910,588 B2
(45) Date of Patent: Feb. 2, 2021

(54) DISPLAY MODULE AND DISPLAY DEVICE COMPRISING THE SAME

(71) Applicant: Samsung Display Co., Ltd., Yongin-si (KR)

(72) Inventors: Hyoung-Joo Kim, Anyang-si (KR); Yunsoo Kim, Asan-si (KR); Jun-Hee Lee, Seoul (KR); Cheollae Roh, Seongnam-si (KR); Gyoowan Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/401,056

(22) Filed: May 1, 2019

(65) Prior Publication Data

US 2019/0386243 A1 Dec. 19, 2019

(30) Foreign Application Priority Data

Jun. 15, 2018 (KR) .................. 10-2018-0068785

(51) Int. Cl.
| | |
|---|---|
| *H01L 51/52* | (2006.01) |
| *G06F 3/041* | (2006.01) |
| *G02B 5/30* | (2006.01) |
| *H05K 5/00* | (2006.01) |
| *G06F 3/0488* | (2013.01) |

(52) U.S. Cl.
CPC ........ *H01L 51/5237* (2013.01); *G02B 5/3025* (2013.01); *G06F 3/0412* (2013.01); *G06F 3/0488* (2013.01); *H05K 5/0017* (2013.01)

(58) Field of Classification Search
CPC . H01L 51/5237; G02B 5/3025; G06F 3/0412; G06F 3/0488
See application file for complete search history.

(56) References Cited

U.S. PATENT DOCUMENTS

| | | | |
|---|---|---|---|
| 8,179,379 B2 | 5/2012 | Hwang et al. | |
| 9,952,729 B2 | 4/2018 | Jang | |
| 10,042,482 B2 | 8/2018 | Kim et al. | |
| 2011/0215484 A1* | 9/2011 | Bond | .................. G06K 9/00053 257/787 |

(Continued)

FOREIGN PATENT DOCUMENTS

| | | |
|---|---|---|
| KR | 10-1373044 B1 | 3/2014 |
| KR | 10-1604781 B1 | 3/2016 |

*Primary Examiner* — Sarah Lhymn
(74) *Attorney, Agent, or Firm* — Lewis Roca Rothgerber Christie LLP

(57) ABSTRACT

A display device includes a substrate including an upper surface, a lower surface, and side surfaces; a display element layer on the upper surface overlapping the display area; an encapsulation layer on the upper surface, the encapsulation layer including a main part that overlaps the display element layer and a protruding part that protrudes along a first direction from the main part and overlaps the bezel area; an input sensor on the main part; a first circuit board facing the main part, overlapping the bezel area, and on the upper surface; and a second circuit board on the protruding part, wherein each of the first circuit board and the second circuit board is adjacent to a first side surface among the side surfaces, and in the first direction, the protruding part is more adjacent to the first side surface than the main part.

20 Claims, 13 Drawing Sheets

(56) References Cited

U.S. PATENT DOCUMENTS

| | | | |
|---|---|---|---|
| 2013/0021289 A1* | 1/2013 | Chen | G06F 1/1643 |
| | | | 345/174 |
| 2015/0028307 A1* | 1/2015 | Kim | H01L 51/5284 |
| | | | 257/40 |
| 2016/0026846 A1* | 1/2016 | Lin | G06K 9/0002 |
| | | | 382/124 |
| 2016/0035759 A1* | 2/2016 | Kwon | H01L 27/1222 |
| | | | 257/40 |
| 2016/0095172 A1* | 3/2016 | Lee | H01L 51/5253 |
| | | | 313/504 |
| 2016/0126498 A1* | 5/2016 | Kim | H01L 51/5234 |
| | | | 257/40 |
| 2017/0034939 A1* | 2/2017 | Fike | H05K 3/30 |
| 2018/0219165 A1* | 8/2018 | Kwon | H01L 51/5284 |
| 2019/0205594 A1* | 7/2019 | Lee | H01L 27/323 |
| 2019/0205596 A1* | 7/2019 | Kim | B06B 1/0692 |
| 2019/0384441 A1* | 12/2019 | Seo | G06F 3/0412 |

* cited by examiner

DISPLAY MODULE AND DISPLAY DEVICE COMPRISING THE SAME

CROSS-REFERENCE TO RELATED APPLICATION

This application claims priority to and the benefit of Korean Patent Application No. 10-2018-0068785, filed on Jun. 15, 2018, the entire content of which is hereby incorporated by reference.

BACKGROUND

The present disclosure relates to a display device, and more particularly, to a display module and a display device comprising the same.

Various display devices used in multimedia devices such as televisions, mobile phones, tablet computers, navigation devices, and game consoles are being developed.

The display device includes a display module displaying images and a circuit board providing electrical signals to the display module. The display module includes a display area in which images are displayed and a bezel area which is adjacent to the display area. Recently, a display device for reducing the bezel area and enlarging the display area is actively being developed.

Meanwhile, the circuit board which provides the electrical signals to the display module is in the bezel area of the display module. However, as the bezel area is reduced, the area where the circuit board is located is also reduced. As a result, in a process of bonding the circuit board to the bezel area, elements in the display area of the display module may be damaged.

The above information disclosed in this Background section is only for enhancement of understanding of the background of the invention and therefore it may contain information that does not constitute prior art.

SUMMARY

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

Aspects of example embodiments of the present disclosure provide a display module which facilitates bonding between a circuit board and the display module, and a display device comprising the same.

An embodiment of the inventive concept provides a display device including: a substrate on which a display area and a bezel area that is adjacent to the display area are located, and which includes an upper surface, a lower surface, and side surfaces that connect the upper surface to the lower surface; a display element layer on the upper surface and overlapping the display area; an encapsulation layer covering the display element layer on the upper surface including a main part that overlaps the display element layer and a protruding part that protrudes along a first direction from the main part and overlaps the bezel area; an input sensing unit (e.g., an input sensor) on the main part; a first circuit board facing the main part in the first direction, overlapping the bezel area on the upper surface; and a second circuit board on the protruding part, wherein each of the first circuit board and the second circuit board is adjacent to a first side surface among the side surfaces in the first direction, the protruding part is more adjacent to the first side surface than the main part.

In an embodiment, the display device may further include a polarization member (e.g., polarizer) overlapping the main part on the input sensing unit (e.g., an input sensor).

In an embodiment, a distance in the first direction between the first circuit board and the polarization member (e.g., polarizer) is the same as a distance in the first direction between the second circuit board and the polarization member (e.g., polarizer) in a plan view of the substrate.

In an embodiment, the display device may further include a first pad portion between the circuit board and the substrate and electrically bonded to the first circuit board, and a second pad portion on the protruding part, and electrically bonded to the second circuit board.

In an embodiment, the first circuit board may be electrically connected to the display element layer through the first pad portion, and the second circuit board may be electrically connected to the input sensing unit (e.g., an input sensor) through the second pad portion.

In an embodiment, a distance in the first direction between the first side surface and the main part is larger than a distance in the first direction between the first side surface and the protruding part.

In an embodiment of the inventive concept, the display device may further include a polarization member (e.g., polarizer) on the encapsulation layer, and an adhesive member (e.g., adhesive) located between the polarization member (e.g., polarizer) and the input sensing unit (e.g., an input sensor).

In an embodiment, the main part may include a first part overlapping the display area, and a second part which is adjacent to the first part and overlaps the bezel area, and the protruding part may protrude along the first direction from the second part.

In an embodiment, in a plan view of the encapsulation layer, one end of the second part adjacent to the first side surfaces is parallel to a second direction crossing the first direction.

In an embodiment, in a plan view of the substrate, the first circuit board and the second circuit board are not overlapping each other.

In an embodiment, in a plan view of the substrate, the protruding part does not overlap the first circuit board.

In an embodiment, the display device may further include a reinforcing member between the protruding part and the substrate.

In an embodiment, in a plan view of the substrate, at least a portion of the reinforcing member overlaps the second circuit board.

In an embodiment of the inventive concept, a display module includes: a substrate on which a display area and a bezel area that is adjacent to the display area are located, which includes a substrate including an upper surface, a lower surface, and side surfaces that connect the upper surface to the lower surface; a display element layer on the upper surface and overlapping the display area; an encapsulation layer covering the display element layer on the upper surface, and including a main part that overlaps the display element layer and a protruding part that protrudes along a first direction from the main part and overlaps the bezel area; and an input sensing unit (e.g., an input sensor) on the main part, wherein in the first direction, the protruding part is more adjacent to the first side surface among the side surfaces than the main part.

In an embodiment, the display module may further include a first pad portion overlapping the bezel area on the upper surface, and a second pad portion on the protruding part, wherein each of the first pad portion and the second pad portion may be adjacent to the first side surface.

In an embodiment, the first pad portion may be electrically connected to the display element layer, and the second pad portion may be electrically connected to the input sensing unit (e.g., an input sensor).

In an embodiment, the display module may further include a polarization member (e.g., polarizer) on the input sensing unit (e.g., an input sensor), and a distance in the first direction between the first pad portion and the polarization member (e.g., polarizer) is longer than a distance in the first direction between the second pad portion and the polarization member (e.g., polarizer).

In an embodiment, the display module may further include a polarization member (e.g., polarizer) on the encapsulation layer.

In an embodiment, the display module may further include an adhesive member (e.g., adhesive) between the polarization member (e.g., polarizer) and the input sensing unit (e.g., an input sensor).

In an embodiment, the main part may be integrally coupled to the protruding part.

In an embodiment of the inventive concept, during bonding between a circuit board and a display module, damage of elements included in the display module can be reduced. Thus, the reliability of the display device may be improved.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1A:
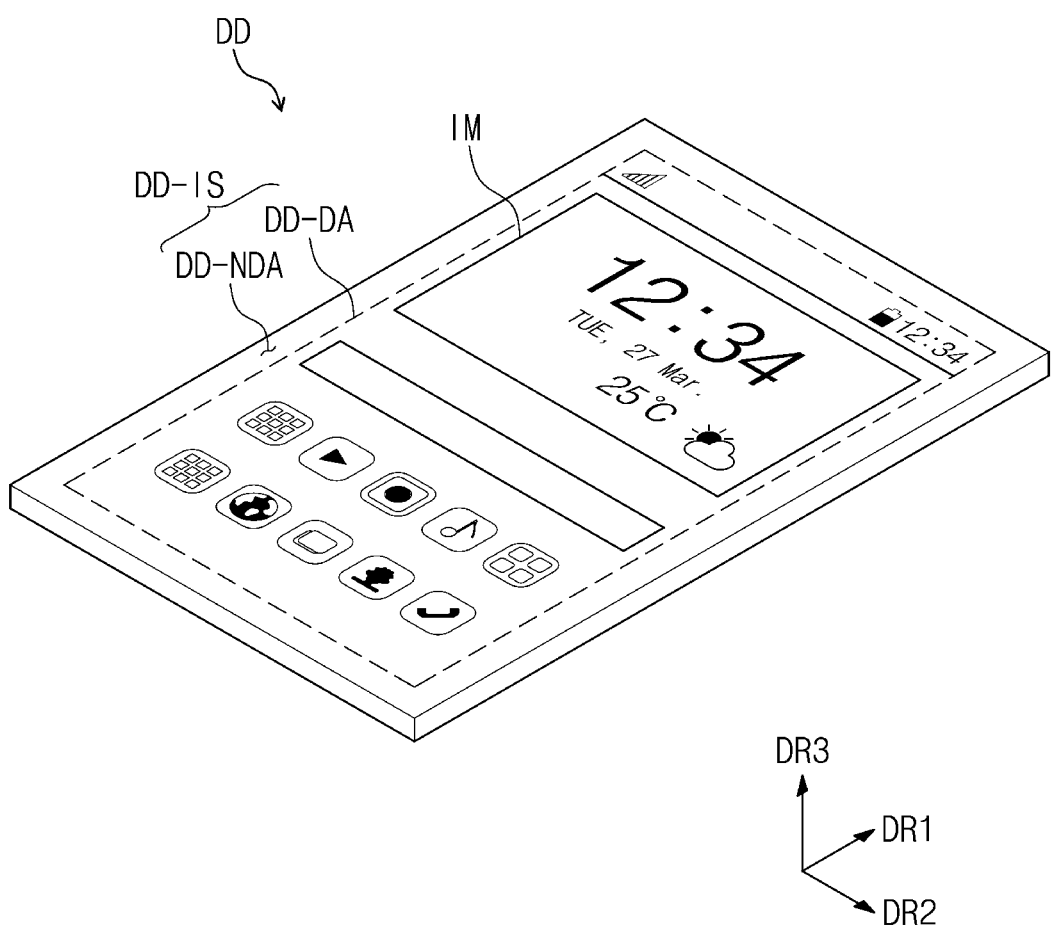
FIG. 1A is a perspective view of a display device according to an example embodiment of the inventive concept.

The detailed description set forth below in connection with the appended drawings is intended as a description of some example embodiments of a display module and a display device comprising the same provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the scope of the invention.

In the present disclosure, when an element (or an area, a layer, a part, etc.) is referred to as "being on", "being connected to", or "being coupled to" another element, this indicates that the element can be directly on/connected to/coupled to the another element or a third element can be therebetween.

Like reference numerals refer to like elements. Also, in the drawings, the thicknesses, the ratios, and the dimensions of the elements may be exaggerated for effective description of a technical content.

The term "and/or" includes any and all combinations of one or more of the associated items.

Although the terms such as "first", "second", etc. may be used herein to describe various elements, these elements should not be limited by these terms. These terms are only used to distinguish one element from another element. For example, a first element could be termed a second component without departing from the scope of the claims of the inventive concept, and similarly a second element could be termed a first component. The singular forms are intended to include the plural forms unless the context clearly indicates otherwise.

In addition, the terms "under", "lower", "above", "upper", etc. are used to describe the correlation between the elements illustrated in the drawings. These terms are relative concepts and are described on the basis of the directions shown in the drawings.

Unless otherwise defined, all terms (including technical terms and scientific terms) used herein have the same meaning as generally understood by those skilled in the art to which the inventive concept belongs. Also, the terms, such as those defined in commonly used dictionaries, should be interpreted as having a meaning that is consistent with their meaning in the context of the relevant art, and will not be interpreted in an idealized or overly formal sense, unless expressly so defined herein.

It should be further understood that the terms "includes/comprises" or "have" etc. specify the presence of stated features, integers, steps, operations, components, parts, or combinations thereof, but do not preclude the possibility of the presence or addition of one or more other features, integers, steps, operations, components, parts or combinations thereof.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Although exemplary embodiments of a display module and a display device comprising the same have been specifically described and illustrated herein, many modifications and variations will be apparent to those skilled in the art. Accordingly, it is to be understood that to a display module and a display device comprising the same constructed according to principles of this invention may be embodied other than as specifically described herein. The invention is also defined in the following claims, and equivalents thereof.

Hereinafter, embodiments of the inventive concept will be described with reference to the drawings.

Figure 1B:
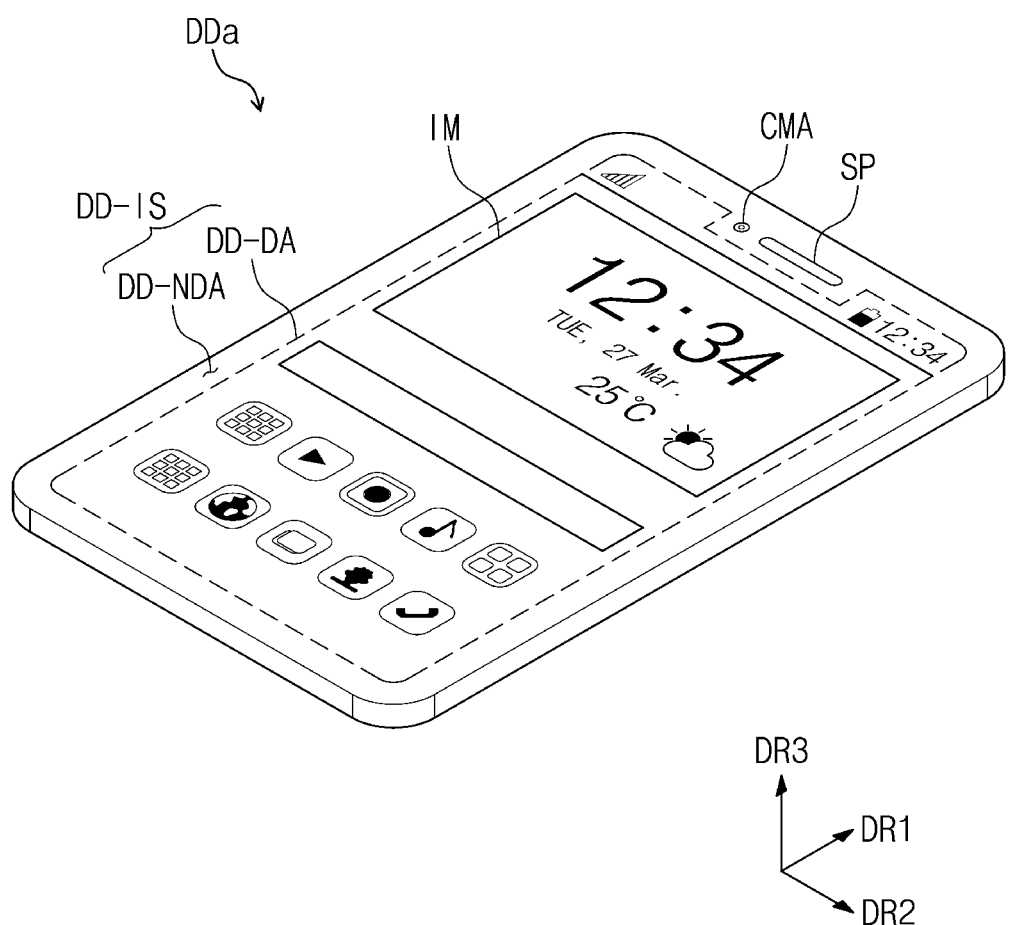
FIG. 1B is a perspective view of a display device according to another example embodiment of the inventive concept.

FIG. 1A is a perspective view of a display device according to an embodiment of the inventive concept. FIG. 1B is a perspective view of the display device according to another embodiment of the inventive concept.

As illustrated in FIG. 1A, the display device DD may display an image IM through a display surface DD-IS. The display surface DD-IS is parallel to a plane defined by a first direction DR1 and a second direction DR2. The perpendicular direction of the display surface DD-IS, that is, the thickness direction of the display device DD, is indicated by a third direction DR3.

A front surface (or an upper surface) and a rear surface (or a lower surface) of each of members or units which will be described hereinafter are distinguished by the third direction DR3. However, the first to the third directions DR1, DR2, DR3 illustrated in the embodiments are merely an example and the directions which are indicated by the first to the third directions DR1, DR2, DR3 may be converted to opposite directions.

According to the description of the inventive concept, although the display device DD provided with a plane display surface DD-IS is illustrated, the inventive concept is not limited thereto. The display device DD may include a curved display surface or a solid display surface. The solid display surface may include a plurality of display areas indicating directions different from each other, and may include, for example, a polyhedron pillar type display surface.

The display device DD may be a rigid display device. However, the inventive concept is not limited thereto. The display device DD according to the inventive concept may be provided as a flexible display device. Also, the display device DD capable of applying to a mobile phone terminal is illustrated in FIG. 1A and FIG. 1B.

In addition, although not shown, electronic modules, a camera module, a power supply module, and the like, which are mounted on a main board may be on a bracket or a case together with the display device DD to constitute the mobile terminal. The display device DD according to the inventive concept may be applied to large electronic devices such as televisions, monitors, etc., as well as small & medium electronic devices such as tablets, car navigation devices, game consoles, smart watches, and so forth.

As illustrated in FIG. 1A, the display surface DD-IS includes a display area DD-DA on which an image IM is displayed and a bezel area DD-NDA which is adjacent to the display area DD-DA. The bezel area is where an image is not displayed. As an example, applications and clock window are illustrated in FIG. 1A.

As illustrated in FIG. 1A, the display area DD-DA is a rectangular shape and the bezel area DD-NDA is illustrated as surrounding the display area DD-DA. However, the inventive concept is not limited thereto. The shape of the display area DD-DA and the shape of the bezel area DD-NDA may be relatively designed. For example, the bezel area DD-NDA may be adjacent to one side of the display area DD-DA or may be completely omitted from the display surface DD-IS.

Referring to FIG. 1B, a display device DDa may include a non-standard shaped display area DD-DA. For example, when compared to the display area illustrated in FIG. 1A, the display area illustrated in FIG. 1B may further include a display area having a shape in which at least one side protrudes in the first direction DR1. The display device DDa may include a speaker SP and a camera module CMA, which are adjacent to the display area having the protruding shape. The speaker SP and the camera module CMA overlap the bezel area DD-NDA and do not overlap the display area DD-DA. Hereinafter, the wording 'overlap' or 'not overlap' means that two elements overlap or do not overlap in the third direction DR3, that is, in the thickness direction of the display device DDa.

Although not shown, the display device DD illustrated in FIG. 1A may also include a speaker SP and a camera module CMA which are positioned to overlap the bezel area DD-NDA.

In addition, at least a portion of the display surface DD-IS illustrated in FIG. 1B may include a curved line. As one example, corners of the display surface DD-IS may be curved.

Figure 2A:
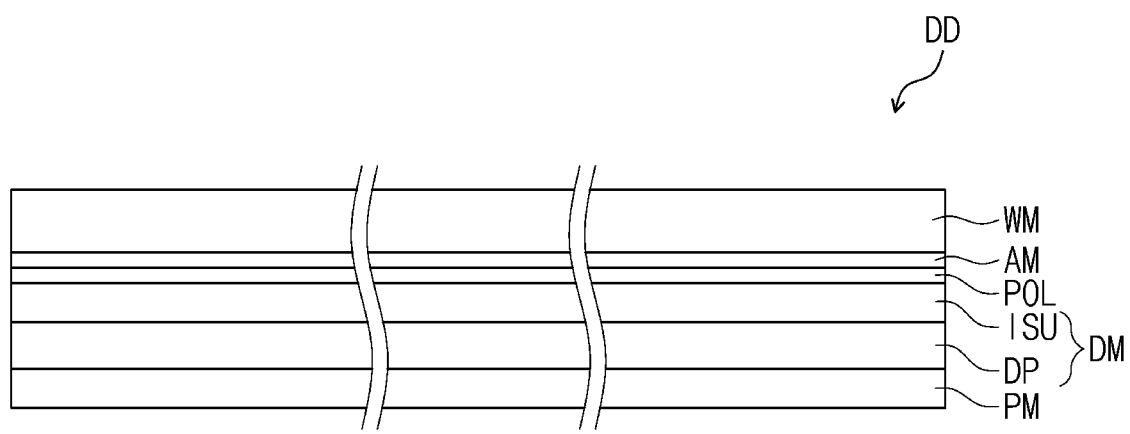
FIG. 2A is a cross-sectional view of a display device according to an example embodiment of the inventive concept.
Figure 2B:
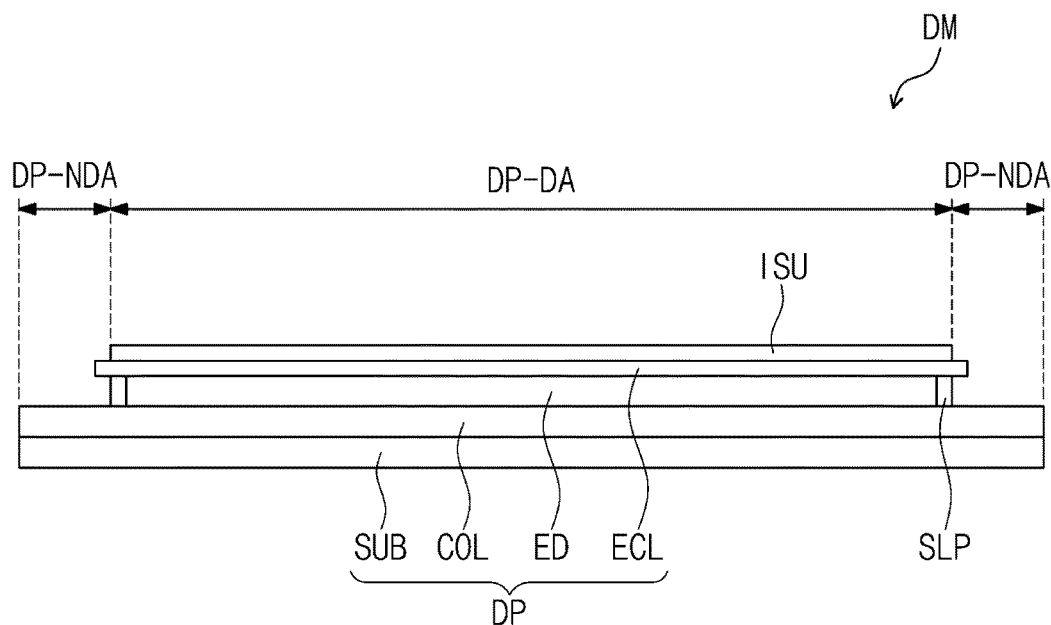
FIG. 2B is a cross-sectional view of the display module illustrated in FIG. 2A according to an example embodiment of the inventive concept.
Figure 2C:
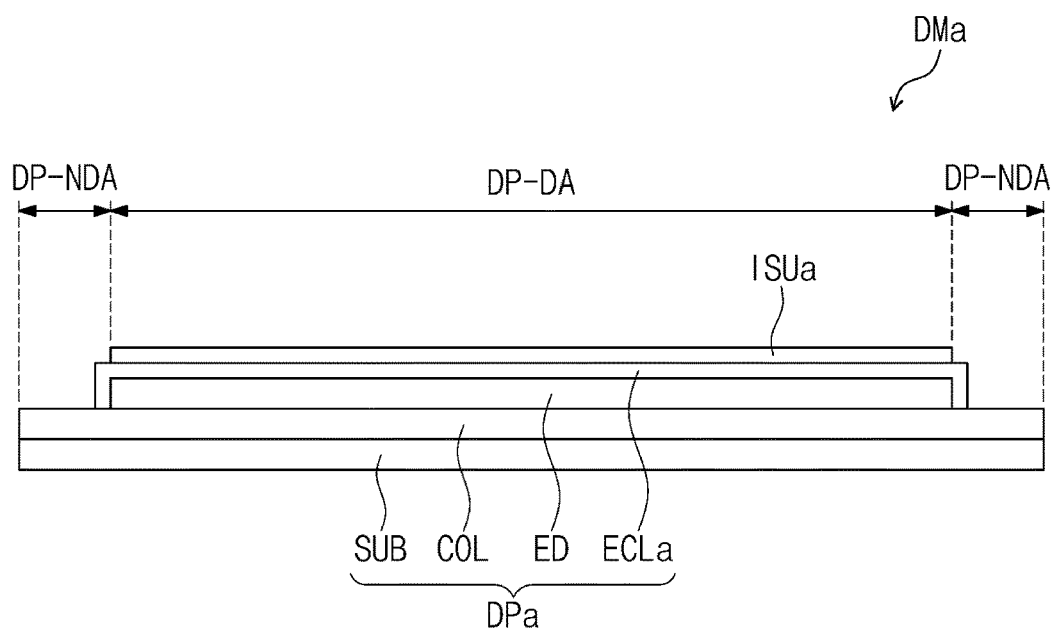
FIG. 2C is a cross-sectional view of the display module illustrated in FIG. 2A according to another example embodiment of the inventive concept.

FIG. 2A is a cross-sectional view of a display device according to an embodiment of the inventive concept. FIG. 2B is a cross-sectional view of the display module illustrated in FIG. 2A according to an embodiment of the inventive concept. FIG. 2C is a cross-sectional view of the display module illustrated in FIG. 2A according to another embodiment of the inventive concept.

Referring to FIG. 2A, a display device DD includes a protection member PM, a display module DM, a polarization member POL (e.g., polarizer), an adhesive member AM (e.g., adhesive), and a window member WM (e.g., window).

The display module DM is located between the protection member PM and the polarization member POL. The adhesive member AM may attach the window member WM to the polarization member POL. Also, when the polarization member POL is omitted, the adhesive member AM may attach the window member WM and the display module DM.

The adhesive member AM may be an optically clear adhesive film (OCA), an optically clear resin (OCR), and/or a pressure sensitive adhesive film (PSA).

The polarization member POL may polarize light emitted from the display panel DP. However, the inventive concept is not limited thereto. The polarization member POL may be on the display panel DP. In this case, the polarization member POL and an input sensing unit ISU (e.g., an input sensor) may be attached to each other by the adhesive member AM.

The protection member PM reduces external moisture from percolating to the display module DM, and absorbs external shock.

The protection member PM may include a plastic film as a base layer. The protection member PM may include a plastic film including at least one selected from the group consisting of polyethersulfone (PES), polyacrylate, polyetherimide (PEI), polyethylenenaphthalate (PEN), polyethyleneterephthalate (PET), polyphenylene sulfide (PPS), polyarylate, polyimide (PI), polycarbonate (PC), polyarylene ethersulfone, and combinations thereof.

Materials constituting the protection member PM are not limited to plastic resins, but may include organic/inorganic composite materials. The protection member PM may include a porous organic layer and inorganic materials filled in pores of the organic layer. The protection member PM may further include a functional layer formed on the plastic film. The functional layer includes a resin layer, and may be formed by a coating method.

Referring to FIG. 2B, the display module DM may include the display panel DP and the input sensing unit ISU (e.g., an input sensor). The display panel DP may be an organic light emitting display panel, a liquid crystal display panel, or a quantum dot light emitting display panel, or the like. The organic light emitting display panel includes organic light emitting elements. The liquid crystal display panel includes liquid crystal molecules. The quantum dot light emitting display panel includes quantum dots, or quantum rods. Hereinafter, the display panel DP according to the inventive concept will be described as the organic light emitting display panel.

Specifically, the display panel DP includes a substrate SUB, a circuit layer COL, a display element layer ED, and an encapsulation layer ECL.

The display panel includes a display area DP-DA and a bezel area DP-NDA. The display area DP-DA and the bezel area DP-NDA of the display panel DP may overlap the display area DP-DA and the bezel area DP-NDA of the display device DD previously defined in each of FIG. 1A and FIG. 1B. The bezel area DP-NDA may be adjacent to one side of the display area DP-DA or may be omitted from the display panel DP.

The substrate SUB may include a plastic substrate, a glass substrate, an organic/inorganic composite material substrate, or the like. Also, the substrate SUB may be a laminated structure including a plurality of insulation layers. The plastic substrate may include at least one of an acrylic resin, a methacrylic resin, a polyisoprene, a vinyl-based resin, an epoxy-based resin, a urethane-based resin, a cellulose-based resin, a siloxane-based resin, a polyimide-based resin, a polyamide-based resin, and/or a perylene-based resin.

The circuit layer COL may include a plurality of insulation layers, a plurality of conductive layers, and a semiconductor layer. The plurality of conductive layers of the circuit layers COL may constitute signal lines and/or a control circuit of pixels.

The display element layer ED overlaps the display area DP-DA, and is on the substrate SUB. The display element layer ED includes display elements, such as organic light emitting diodes. However, an embodiment of the inventive concept is not limited thereto, and according to the type of the display panel DP, the display element layer ED may include inorganic light emitting diodes and/or organic-inorganic hybrid light emitting diodes.

The encapsulation layer ECL seals the display element layer ED. In one embodiment, the encapsulation layer ECL overlaps each of the display area DP-DA and the bezel area DP-NDA, or may not overlaps the bezel area DP-NDA.

According to an embodiment, the encapsulation layer ECL may be an encapsulation substrate. The encapsulation layer ECL protects the display element layer ED from foreign substances such as water, oxygen, and particles of dust. The encapsulation layer ECL may be coupled to the substrate SUB through a sealing member SLP. The sealing member SLP may include a frit. However, this is merely an exemplary embodiment, and the material constituting the sealing member is not limited thereto.

The input sensing unit ISU (e.g., an input sensor) may overlap the display area DP-DA, and may be on the encapsulation layer ECL. In FIG. 2B, the encapsulation layer ECL is described as an element included in the display panel DP, but the encapsulation layer ECL may be defined as an element included in the input sensing unit ISU.

While FIG. 2B shows that the input sensing unit ISU is formed directly on the encapsulation layer ECL by a continuous process, the inventive concept is not limited thereto. For example, an adhesive member (e.g., adhesive) may be located between the input sensing unit ISU and the encapsulation layer ECL, and thus the input sensing unit ISU and the encapsulation layer ECL may be attached to each other by the adhesive member (e.g., adhesive).

Referring FIG. 2C, a display module DMa may include an input sensing unit ISUa. Compared to the display module DM shown in FIG. 2B, the display module DMa shown in FIG. 2C has a configuration in which only an encapsulation layer ECLa is changed, and the remaining elements may be substantially the same.

The display panel DPa includes the substrate SUB, the circuit layer COL, and the encapsulation layer ECLa.

The encapsulation layer ECLa seals the display element layer ED. As one embodiment, the encapsulation layer ECLa may overlap each of the display area DP-DA and the bezel area DP-NDA, or may not overlap the bezel area DP-NDA. The encapsulation layer ECLa includes at least one insulation layer. The encapsulation layer ECLa according to an embodiment of the inventive concept may include at least one encapsulation organic layer and at least one encapsulation inorganic layer.

The encapsulation inorganic layer protects the display element layer ED from water/oxygen, and the encapsulation organic layer protects the display element layer ED from foreign substances such as particles of dust. The encapsulation inorganic layer may include a silicon nitride layer, a silicon oxynitride layer, a silicon oxide layer, a titanium oxide layer, and/or an aluminum oxide layer, but is not particularly limited thereto. The encapsulation inorganic layer may include an acrylic-based organic layer, but is not particularly limited thereto.

The input sensing unit ISUa may be formed directly on the encapsulation layer ECLa by a continuous process. However, the inventive concept is not limited thereto, and the input sensing unit ISUa may be coupled to the encapsulation layer ECLa through an adhesive member (e.g., adhesive). In this case, the input sensing unit may include a base layer and a sensing circuit layer. The sensing circuit layer may include a plurality of insulation layers, and a plurality of conductive layers.

Figure 3:
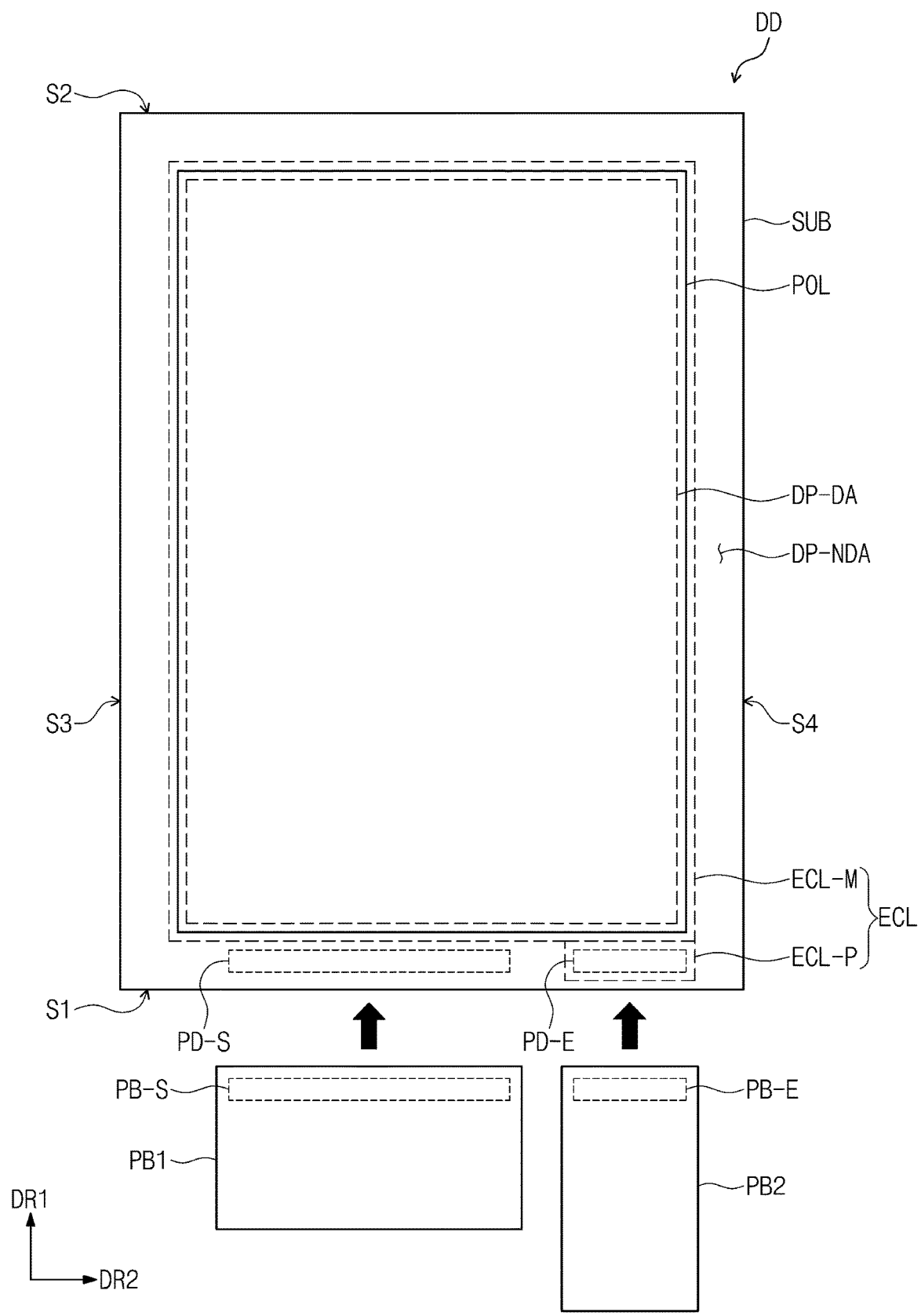
FIG. 3 is a plan view of a display device according to an example embodiment of the inventive concept.

FIG. 3 is a plan view of a display device according to an embodiment of the inventive concept. The display device DD further includes a first circuit board PB1 and a second circuit board PB2 in addition to the elements described above in FIG. 2A and FIG. 2B.

Referring to FIG. 2A, FIG. 2B and FIG. 3, it can be seen that the encapsulation layer ECL is on the substrate SUB, and the polarization member POL is on the encapsulation layer ECL. In this case, the polarization member POL is on the input sensing unit ISU or on the encapsulation layer ECL.

Specifically, the substrate SUB includes an upper surface, a lower surface, and a plurality of side surfaces S1, S2, S3, and S4 connecting the upper surface to the lower surface. The display area DP-DA, on which an image is displayed, and the bezel area DP-NDA adjacent to the display area DP-DA are in the substrate SUB. Also, a first bonding area PD-S in which a plurality of first pads PD1 are located, is in the upper surface of the substrate SUB. The first pads PD1 are electrically connected to the display element layer ED, and may transmit electrical signals. The first bonding area PD-S is adjacent to the first side surface S1 and overlaps the bezel area DP-NDA.

The first circuit board PB1 may be adjacent to the first side surface S1 among the side surfaces S1-S4, and may be on the upper surface of the substrate SUB overlapping the bezel area DP-NDA. A driving pad area PB-S in which a plurality of a first pads PD1 are located, is in the first circuit board PB1. The first driving pads PDS1 on the driving pad area PB-S may be electrically bonded to the first pads PD1 on the first bonding area PD-S. The first pads PD1 may be described as a first pad portion.

According to an embodiment of the inventive concept, the encapsulation layer ECL may include a main part ECL-M and a protruding part ECL-P. The protruding part ECL-P may have a shape protruding along the first direction DR1 from the main part ECL-M.

The main part ECL-M may include a first part overlapping the display area DP-DA, and a second part overlapping the bezel area DP-NDA. The first part of the main part ECL-M may overlap the display element layer ED described in FIG. 2B. The second part may overlap the bezel area DP-NDA. One end of the second part of the main part ECL-M adjacent to the first side surface S1 may be parallel to the second direction DR2. The input sensing unit ISU may be on the main part ECL-M. Meanwhile, the second part of the main part ECL-M may be omitted in another embodiment.

In addition, the main part ECL-M does not overlaps the first bonding area PD-S, and the main part ECL-M and the first bonding area PD-S are spaced apart by a set or predetermined distance in the first direction DR1. For one example, the main part ECL-M may be rectangular shaped. The shape of the main part ECL-M is not particularly limited, and the main part ECL-M may have a polygonal shape or a non-standard shape only at one side thereof.

The protruding part ECL-P may protrude from the second part of the main part ECL-M along the first direction DR1 so as to be adjacent to the first side surface S1. In this case, the protruding part ECL-P does not overlap the first circuit board PB1 bonded to the first bonding area PD-S.

A second bonding area PD-E in which a plurality of second pads PD2 are located, is on the protruding part ECL-P. The second pads PD2 are electrically connected to the input sensing unit ISU, and transmit electrical signals to the input sensing unit ISU. The second bonding area PD-E is adjacent to the first surface S1 and overlaps the bezel area DP-NDA.

The second circuit board PB2 may be adjacent to the first side surface S1 among the side surfaces S1-S4, and may be on the upper surface of the protruding part ECL-P overlapping the bezel area DP-NDA. The first circuit board PB1 and the second circuit board PB2 do not overlap each other. A sensing pad area PB-E in which a plurality of second driving pads PDS2 are located, is defined in the second circuit board PB2. The second driving pads PDS2 on the sensing pad area PB-E may be electrically bonded to the second pads PD2 on the second bonding area PD-E. The second pads PD2 may be described as a second pad portion.

Meanwhile, in an embodiment in which the protruding part ECL-P is omitted, the second pads PD2 and the second circuit board PB2 bonded to the second pads PD2 may be on the second part of the main part ECL-M. However, as the area of the second part is narrowed, the distance between the second circuit board PB2 in the second part and the polarization member POL, or the distance between the second circuit board PB2 and the input sensing unit ISU may be shortened in the first direction DR1. As a result, the polarization member POL which is on the main part ECL-M, or elements of the input sensing unit ISU which are on the main part ECL-M, may be damaged in a process of bonding the second circuit board PB2 to the second part.

According to an embodiment of the inventive concept, as the protruding part ECL-P protrudes from the main part ECL-M toward the first side surface S1 in the first direction DR1, the protruding part ECL-P may be closer to the first side surface S1 than the main part ECL-M.

Particularly, the second pads PD2 are on the second bonding area PD-E of the protruding part ECL-P. That is, as the second circuit board PB2 is on the protruding part ECL-P, and not on the second part, the distance between the second circuit board PB2 and the polarization member POL, or the distance between the second circuit board PB2 and the input sensing unit ISU in the first direction DR1 may be increased. As a result, in the process of bonding the second driving pads PDS2 on the sensing pad area PB-E of the second circuit board PB2, to the second pads PD2, a damage of the polarization member POL and/or the elements of the input sensing unit ISU may be reduced. Thus, the driving reliability of the inventive concept may be improved.

The polarization member POL may be on the input sensing unit ISU while overlapping the main part ECL-M.

The polarization member POL may overlap each of the first part and the second part of the main part ECL-M. In this case, the polarization member POL may entirely overlap the first part.

Figure 4A:
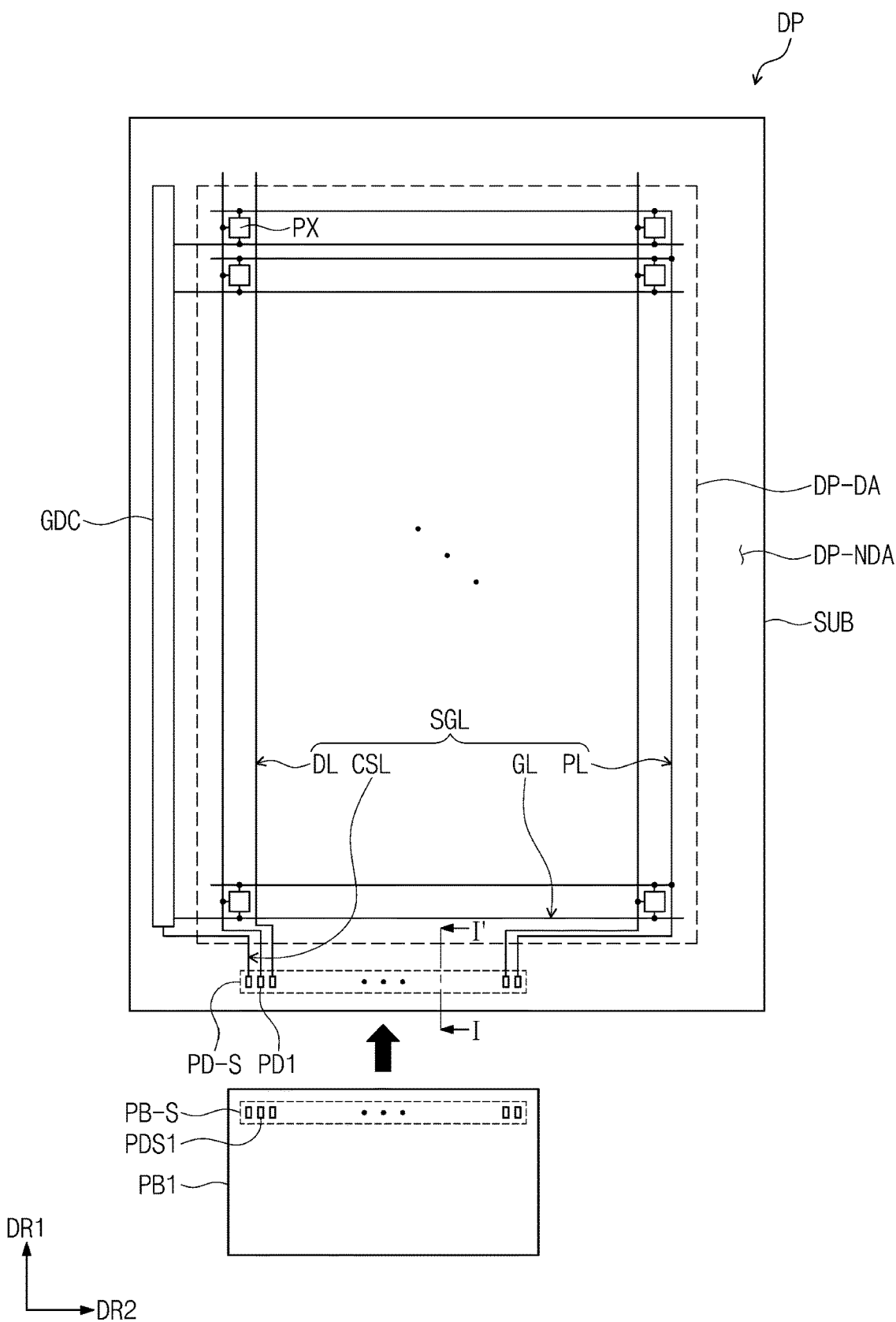
FIG. 4A is a plan view of a display panel according to an example embodiment of the inventive concept.
Figure 4B:
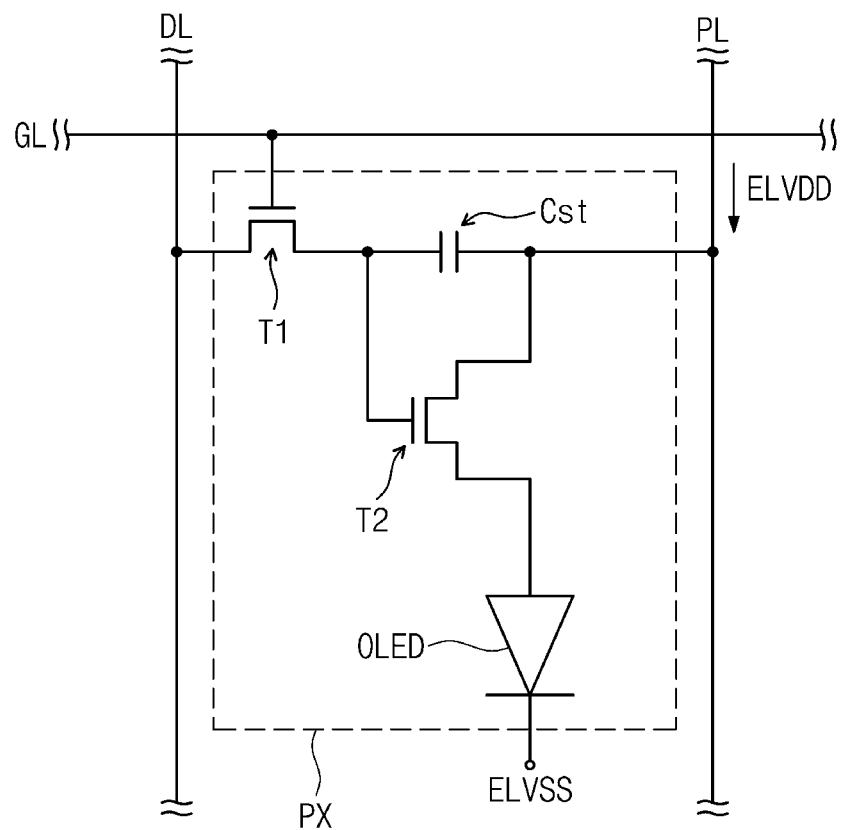
FIG. 4B is an equivalent circuit diagram of the pixel illustrated in FIG. 4A.
Figure 4C:
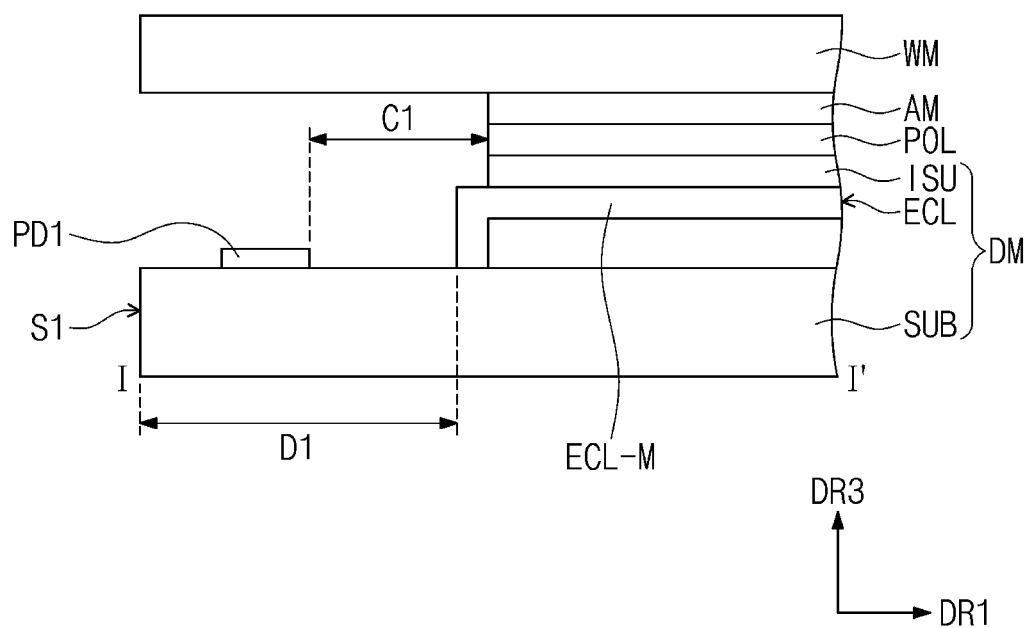
FIG. 4C is a cross-sectional view taken along line I-I' illustrated in FIG. 4A.

FIG. 4A is a plan view according to an embodiment of the inventive concept. FIG. 4B is an equivalent circuit diagram of the pixel illustrated in FIG. 4A. FIG. 4C is a cross-sectional view taken along line I-I' illustrated in FIG. 4A.

Referring FIG. 4A, the display panel DP may include a driving circuit GDC, a plurality of signal lines SGL, a plurality of first pads PD1 on a first bonding area PD-S, and a plurality of pixels PX.

The pixels PX are on the display area DP-DA. Each of the pixels includes an organic light emitting diode, and a pixel driving circuit connected thereto. The driving circuit GDC, the signal lines SGL, the first pads PD1, and the pixel driving circuit may be included in the circuit layer COL illustrated in FIG. 2B.

The driving circuit GDC may include a scan driving circuit. The scan driving circuit generates a plurality of scan signals (hereinafter, referred to as scan signals), and sequentially outputs the scan signals to a plurality of scan lines GL (hereinafter, referred to as scan lines) which will be described below. The scan driving circuit may further output another control signal to the pixel driving circuit of the pixels PX.

The driving circuit GDC may include a plurality of thin film layer transistors which are formed through the same process as a process for forming the pixel driving circuit of the pixels, for example, a low-temperature polycrystalline silicon (LTPS) process or a low-temperature polycrystalline oxide (LTPO) process.

The signal lines SGL may be on the substrate SUB. The signal lines SGL include the scan lines GL, data lines DL, a power supply line PL, and a control signal line CSL. The respective scan lines GL are connected to the corresponding pixels among the pixels PX, and the respective data lines DL are connected to the corresponding pixels among the pixels PX. The power supply line PL is connected to the pixels PX. The control signal line CSL may provide control signals to the driving circuit GDC.

The signal lines SGL overlap the display area DP-DA and the bezel area DP-NDA. Each of the signal lines SGL may include a pad portion and a line portion. The line portion overlaps the display area DP-DA and the bezel area DP-NDA. The pad portion is connected to the end of the line portion. The pad portion may be on the bezel area DP-NDA, and correspond to the first pads PD1 on the first bonding area PD-S described above.

The first circuit board PB1 may be connected to the display panel DP, and may include the first driving pads PDS1 on the driving pad area PB-S. The first driving pads PDS1 of the first circuit board PB1 may be connected to the first pads PD1 of the display panel DP, and transmit a plurality of driving signals to the display panel DP. The first circuit board PB1 may be rigid or flexible. For example, when the first circuit board PB1 is flexible, the first circuit board PB1 may be a flexible printed circuit board.

Meanwhile, although it is illustrated in FIG. 4A that the first circuit board PB1 and the display panel DP are separated from each other, the first circuit board PB1 may be connected to the display panel DP, and may be bent along the first side surface S1 of the substrate SUB and may be on the rear surface of the display panel DP.

In addition, a timing control circuit controlling an operation of the display panel DP may be on the first circuit board PB1. The timing control circuit may be mounted on the first circuit board PB1 in the form of an integrated chip.

FIG. 4B illustrates one scan line GL, one data line DL, the power supply line PL, and the pixel PX connected to these lines. The configuration of the pixel PX may not be limited to that of FIG. 4B.

The organic light emitting diode may be a top emission-type diode or a bottom emission-type diode. The pixel PX includes a first transistor T1 (or a switching transistor), a second transistor T2 (or a driving transistor), and a capacitor Cst as the pixel driving circuit driving the organic light emitting diode OLED. A first power voltage ELVDD is provided to the second transistor T2, and a second power voltage ELVSS is provided to the organic light emitting diode OLED. The second power voltage ELVSS may be less than the first power voltage ELVDD, and in one example, may be a ground voltage.

The first transistor T1 outputs a data signal applied to the data line DL in response to a scan signal applied to the gate line GL. The capacitor Cst charges to a voltage correspond to the data signal received from the first transistor T1. The second transistor T2 is connected to the organic light emitting diode OLED. The second transistor T2 controls driving current flowing through the organic light emitting diode OLED to correspond to an amount of charge stored in the capacitor Cst.

The equivalent circuit illustrated in FIG. 4B is merely an example and thus the inventive concept is not limited thereto. The pixel PX may further include a plurality of transistors and may include a larger number of capacitors.

Referring FIG. 4C, the distance in the first direction DR1 between the first pads PD1 and the polarization member POL of the first bonding area PD-S on the substrate SUB, is defined as a first length C1. Alternatively, the distance between the first pads PD1 and the input sensing unit ISU of the first bonding area PD-S on the substrate SUB, may be defined as a first length C1. The distance in the first direction DR1 between the first side surface S1 and the main part ECL-M of the encapsulation layer ECL is defined as a first comparison length D1.

Meanwhile, the first pads PD1 of the first bonding area PD-S overlap the bezel area DP-NDA and are on the substrate SUB. Even if the first length C1 is shortened to reduce the bezel area DP-NDA, a physical pressurization is not transmitted to the input sensing unit ISU and the polarization member POL in a process of bonding the first pads PD1 and the first circuit board PB1 to each other.

Figure 6A:
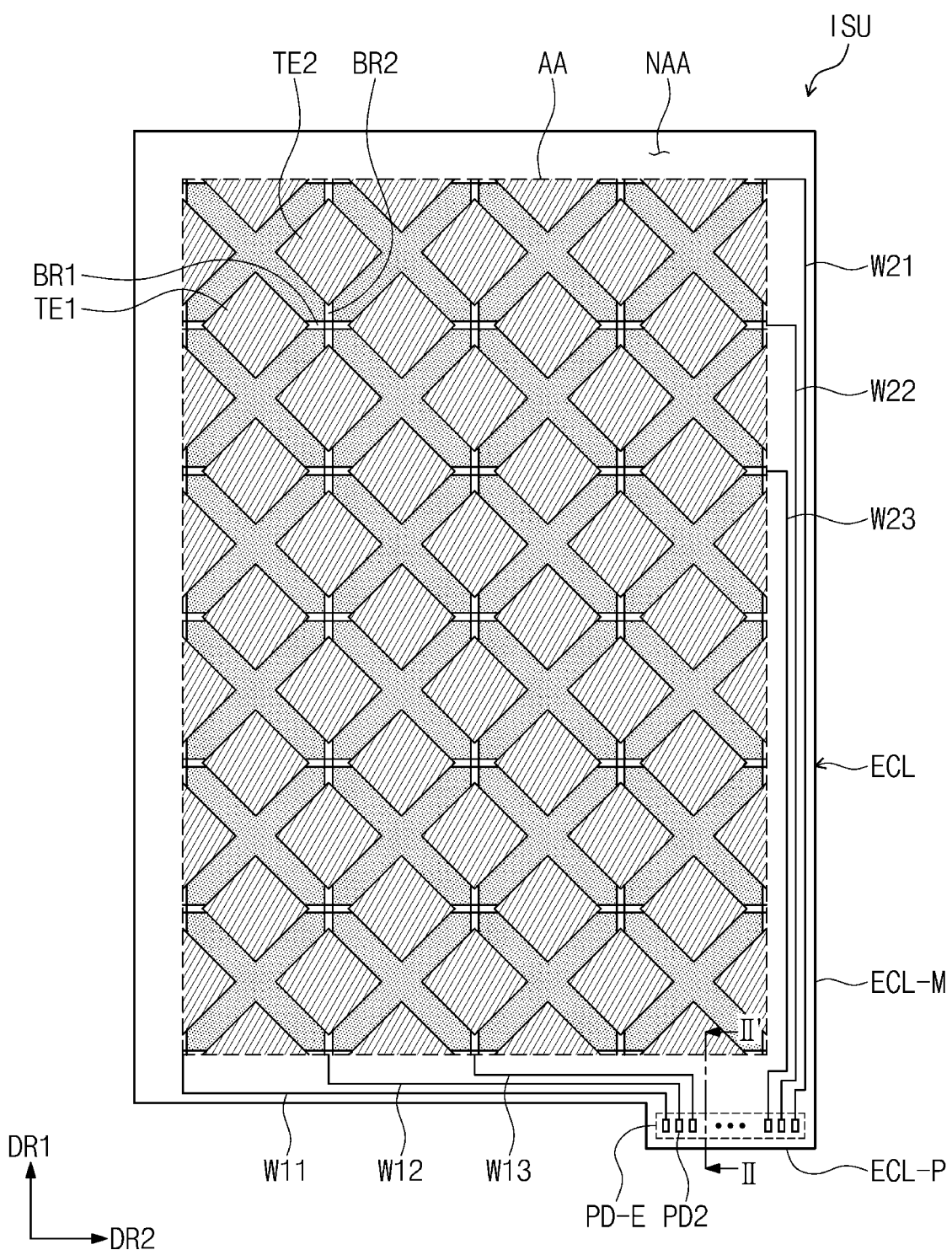
FIG. 6A is a plan view of an input sensing unit (e.g., an input sensor) according to an example embodiment of the inventive concept.

In addition, the second pads PD2 of the second bonding area PD-E, which will be described later with respect to FIG. 6A, are on the encapsulation layer ECL, but may be spaced apart from the main part ECL-M of the first encapsulation layer ECL by a length substantially equal to the first length C1, in the first direction DR1. This will be described with respect to FIG. 6B in more detail.

Figure 5A:
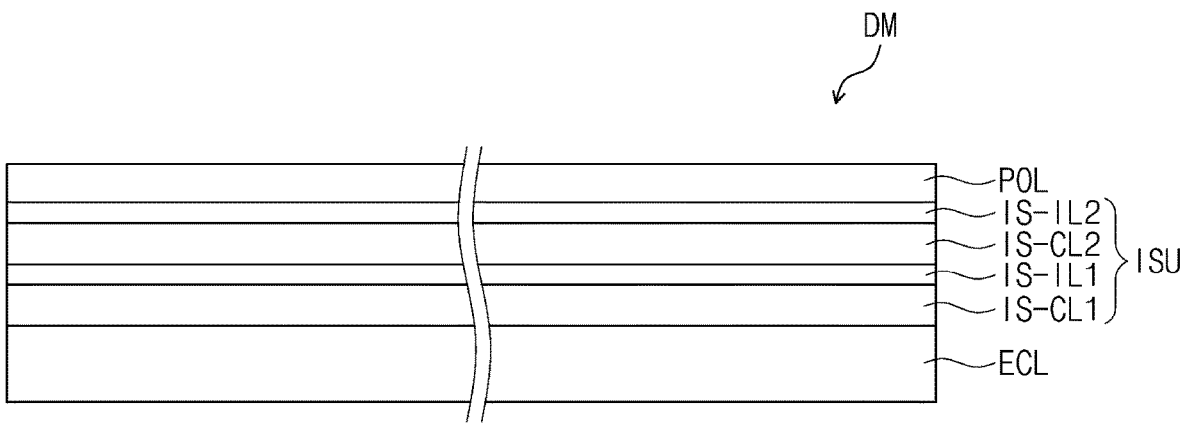
FIG. 5A is a cross-sectional view of a display module according to an example embodiment of the inventive concept.
Figure 5B:
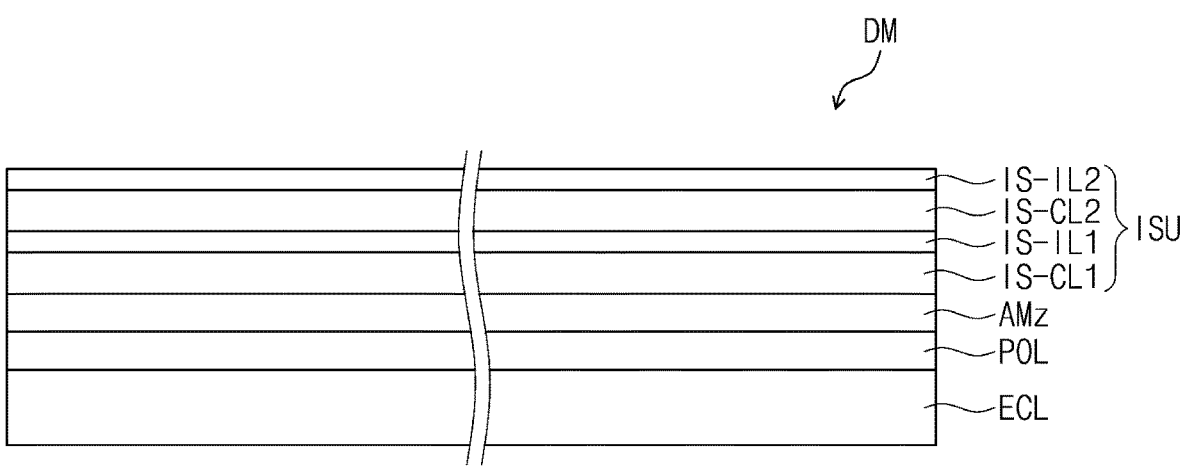
FIG. 5B is a cross-sectional view of a display module according to another example embodiment of the inventive concept.

FIG. 5A is a cross-sectional view of a display module according to an embodiment of the inventive concept. FIG. 5B is a cross-sectional view of a display module according to another embodiment of the inventive concept.

In FIG. 5A and FIG. 5B, a configuration in which the polarization member POL is included in the display module DM is described.

Referring FIG. 5A, an input sensing unit ISU includes a first conductive layer IS-CL1, a first insulation layer IS-IL1, a second conductive layer IS-CL2, and a second insulation layer IS-IL2.

According to an embodiment of the inventive concept, the first conductive layer IS-CL1, the first insulation layer IS-IL1, the second conductive layer IS-CL2, and the second insulation layer IS-IL2 are sequentially stacked on an encapsulation layer ECL. That is, the first conductive layer IS-CL1 may be directly on the encapsulation layer ECL.

Each of the first conductive layer IS-CL1 and the second conductive layer IS-CL2 may have a single-layer structure or a multi-layer structure in which multiple layers are stacked along the third direction DR3. The conductive layers of the multilayer structure may include a transparent conductive layer and at least one metal layer. The conductive layers of the multi-layer structure may include metal layers containing different metals. The transparent conductive layer may include indium tin oxide (ITO), indium zinc oxide (IZO), zinc oxide (ZnO), indium tin zinc oxide (ITZO), PEDOT, metal nanowire, and/or graphene. The metal layer may include molybdenum, silver, titanium, copper, aluminum, and/or an alloy thereof.

Each of the first conductive layer IS-CL1 and the second conductive layer IS-CL2 may include a plurality of sensing electrodes. Hereinafter, an example in which the first conductive layer IS-CL1 includes first sensing electrodes and the second conductive layer IS-CL2 includes second sensing electrodes is described. The first conductive layer IS-CL1 and the second conductive layer IS-CL2 may include signal lines connecting the first sensing electrodes and the second sensing electrodes.

Each of the first insulation layer IS-IL1 and the second insulation layer IS-IL2 may include an inorganic material and/or an organic material. The inorganic material may include silicon oxide and/or silicon nitride. The organic material may include at least one selected from an acryl-based resin, a methacrylic resin, a polyisoprene, a vinyl resin, an epoxy-based resin, a urethane-based resin, a cellulose-based resin, and a perylene-based resin.

The first insulation layer IS-IL1 is not particularly limited in shape so long as it may insulate the first conductive layer IS-CL1 and the second conductive layer IS-CL2. The shape of the first insulation layer IS-IL1 may be changed depending on the shapes of the first sensing electrodes and the second sensing electrodes.

According to the inventive concept, a two-layered electrostatic capacitive type input sensing unit ISU is illustrated. However, the input sensing unit ISU may be driven by a self-capacitance method, and a driving method of the input sensing unit ISU for acquiring coordinate information, is not particularly limited.

In addition, according to an embodiment of the inventive concept, the polarization member POL may be on the second insulation layer IS-IL2. In an example, an adhesive member (e.g., adhesive) may be located between the polarization member POL and the second insulation layer IS-IL2.

Referring FIG. 5B, a polarization member POL may be on an encapsulation layer ECL. In an example, an adhesive member AMz (e.g., adhesive) may be located between the polarization member POL and the input sensing unit ISU. In this case, an input sensing unit ISU may be attached to the polarization member POL through the adhesive member AMz. That is, the input sensing unit ISU may be a separate element connected to the polarization member POL through the adhesive member AMz.

Figure 6B:
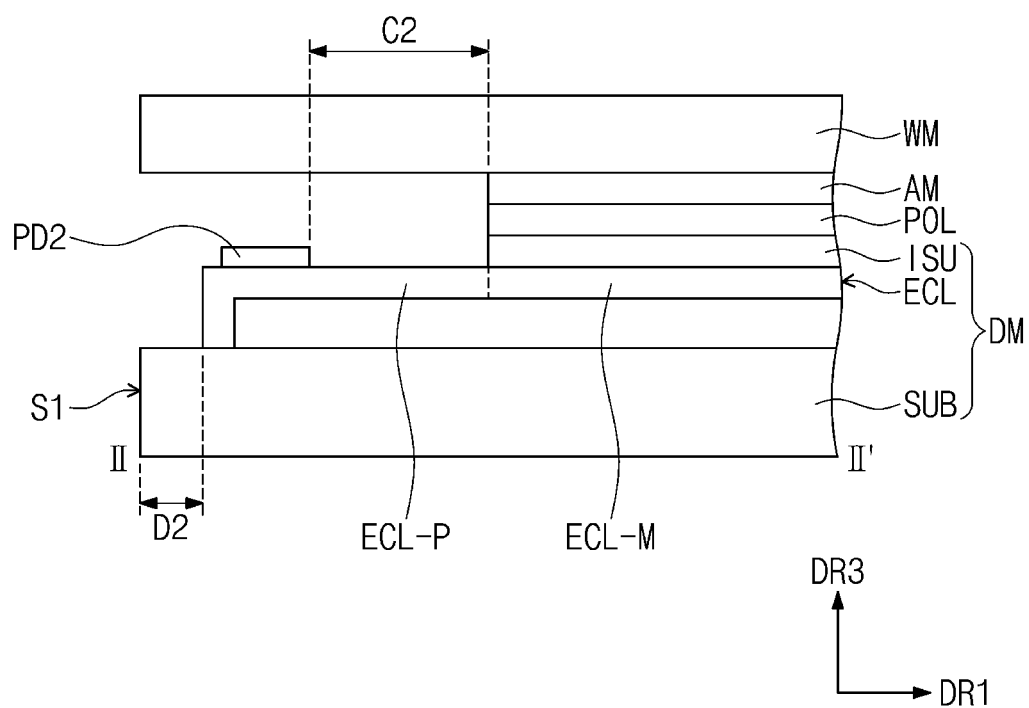
FIG. 6B is a cross-sectional view taken along line II-II' illustrated in FIG. 6A.

FIG. 6A is a plan view of an input sensing unit according to an embodiment of the inventive concept. FIG. 6B is a cross-sectional view taken along line II-II' illustrated in FIG. 6A.

The input sensing unit ISU includes a plurality of first sensing electrodes, a plurality of second sensing electrodes, a plurality of signal lines W11, W12, W13, W21, W22, and W23, and a plurality of second pads PD2 on a second bonding area PD-E.

The input sensing unit ISU may be on an encapsulation layer ECL, and an active area AA and a non-active area NAA adjacent to the active area AA are in the encapsulation layer ECL. In an example, the active area AA may overlap the display area DP-DA illustrated in FIG. 4A, and the non-active area NAA may overlap the bezel area DP-NDA illustrated in FIG. 4A.

In addition, the active area AA may be an area for detecting an input applied from the outside. An externally applied input may be provided in various suitable forms. For example, the external input may include various suitable types (or kinds) of external inputs such as a part of a user's body, a stylus pen, a light, a heat, a pressure, etc. Also, an input applied by touch between the active area and a part of a user's body, such as a user's hand, as well as a space touch (for example, hovering) close to or adjacent to the active area, may be a form of the input.

According to an embodiment of the inventive concept, the first sensing electrode and the second sensing electrode may overlap the active area AA and be on the main part ECL-M of the encapsulation layer ECL. Signal lines W11, W12, W13, W21, W22, and W23 may overlap the non-active area NAA and be on the main part ECL-M and the protruding part ECL-P. The plurality of second pads PD2 on the second bonding area PD-E may overlap the non-active area NAA and may be on the protruding part ECL-P. As described above with respect to FIG. 3, the second circuit board PB2 may be electrically bonded to the second pads PD2 on the protruding part ECL-P.

The first sensing electrodes may have a shape in which the first sensing electrodes are respectively arranged in the first direction DR1 and extend in the second direction DR2. Each of the first sensing electrodes may include a plurality of first sensor portions TE1 (e.g., first sensors) and a plurality of first connection portions BR1 connecting the plurality of first sensor portions TE1. In an example, n number of first sensing electrodes may be provided, and may be arranged in the first direction DR1. Here, n is a natural number.

According to an embodiment of the inventive concept, a $1^{st}$ first sensing electrode and an n-th first sensing electrode among the n number of first sensing electrodes may be closest to the non-active area NAA. As illustrated in FIG. 4B, the $1^{st}$ first sensing electrode and the n-th first sensing electrode face each other in the first direction DR1, and are closest to the non-active area NAA. In particular, the first sensor portions included in the $1^{st}$ first sensing electrode and the n-th first sensing electrode may be different in shape from the first sensing portions included in the $2^{nd}$ first sensing electrode to (n-1)-th first sensing electrode.

For example, the first sensor portions included in the $1^{st}$ first sensing electrode and the n-th first sensing electrode may have a shape of a portion of the first sensor portions included in the $2^{nd}$ first sensing electrode to the (n-1)-th first sensing electrode.

The second sensing electrodes may be respectively insulated from the first sensing electrodes, and may have a shape in which the second sensing electrodes extend in the first direction DR1 and are arranged in the second direction DR2. Each of the second sensing electrodes may include a plurality of second sensor portions TE2 (e.g., second sensors) and a plurality of second connection portions BR2 connecting the plurality of second sensor portions TE2 (e.g., second sensors). In an example, m number of second sensing electrodes may be provided, and may be arranged in the second direction DR2. Here, m is a natural number.

According to an embodiment of the inventive concept, a $1^{st}$ second sensing electrode and an m-th second sensing electrode may be closest to the non-active area NAA among the m number of second sensing electrodes. The $1^{st}$ second sensing electrode and the m-th second sensing electrode face each other in the second direction DR2, and are closest to the non-active area NAA. In particular, the second sensor portions included in the first second sensing electrodes and the m-th second sensing electrodes may be different in shape from the second sensing portions included in the $2^{nd}$ second sensing electrode to (m-1)-th second sensing electrode.

For example, the second sensor portions included in the $1^{st}$ second sensing electrode and the m-th second sensing electrode may have a shape of a portion of the second sensor portions included in the $2^{nd}$ second sensing electrode to the (m-1)-th second sensing electrode.

The input sensing unit ISU may detect the input coordinates through a change in electrostatic capacitance between the first sensing electrodes and the second sensing electrodes.

That is, the first sensor portions TE1 may output a sensing signal, and the plurality of second sensor portions TE2 may receive a driving signal. In this regard, the input sensing unit ISU may scan the active area AA by applying a driving signal to the second sensor portions TE2, and may detect the touch area where the touch is applied through the sensing signal outputted from the first sensor portions TE1. In another example, the first sensor portions TE1 may receive the driving signal, and the second sensor portions TE2 may output the sensing signal, and the first sensor portions TE1 and the second sensor portions TE2 may additionally receive or output other electrical signals.

Meanwhile, this is merely an exemplarily illustration, and the input sensing unit ISU may sense an external touch through various methods such as a resistance film method, an optical method, an ultrasonic method, and/or a coordinate detection method, and may have an electrode structure corresponding thereto.

A plurality of signal lines and a plurality of second pads PD2 may be in the non-active area NAA. According to the description of the inventive concept, for convenience of explanation, some first signal lines W11, W12, and W13 and some second lines W21, W22, and W23 of the plurality of signal lines are illustrated. First ends of the first signal lines W11, W12, and W13 are connected to the second sensing electrodes, respectively, and first ends of the second signal lines W21, W22 and W23 are connected to the first sensing electrodes. Each of the lines among the plurality of lines may be connected to the corresponding electrode among the first sensing electrodes and the second sensing electrodes.

Referring FIG. 6B, the distance in the first direction DR1 between the second pads PD2 of the second bonding area PD-E on the protruding part ECL-P and the polarization member POL is defined as a second length C2. In addition, the distance between the second pads PD2 of the second bonding area PD-E on the protruding part ECL-P and the input sensing unit ISU may be defined as the second length C2. The distance in the first direction DR1 between the first side surface S1 and the protruding part ECL-P of the encapsulation layer ECL is defined as a second comparison length D2.

Meanwhile, as described above with respect to FIG. 4C, the distance in the first direction DR1 between the first pads PD1 of the first bonding area PD-S on the substrate SUB and the polarization member POL is defined as a first length (C1). In addition, the distance in the first direction DR1 between the first side surface S1 and the main part ECL-M of the encapsulation layer ECL is defined as a first comparison length D1.

According to the present embodiment, the first length C1 in the first direction DR1 between the first pads PD1 bonded to the first circuit board PB1 and the polarization member POL may be substantially the same as the second length C2 in the first direction DR1 between the second pads PD2 bonded to the second circuit board PB2 and the polarization member POL.

As described above, the distance between the second pads PD2 and the polarization member POL may be defined by a second length C2 substantially equal to the first length C1. Thus, in a process of bonding the second pads PD2 and the second circuit board PB2 of the second bonding area PD-E to each other, physical pressurization can be prevented or reduced from being transmitted to the input sensing unit ISU and the polarization member POL.

In addition, according to the present embodiment, the first comparison length D1 in the first direction DR1 between the first side surface S1 and the main part ECL-M may be longer than the second comparison length D2 between the first side surface S1 and the protruding part ECL-P.

Figure 7A:
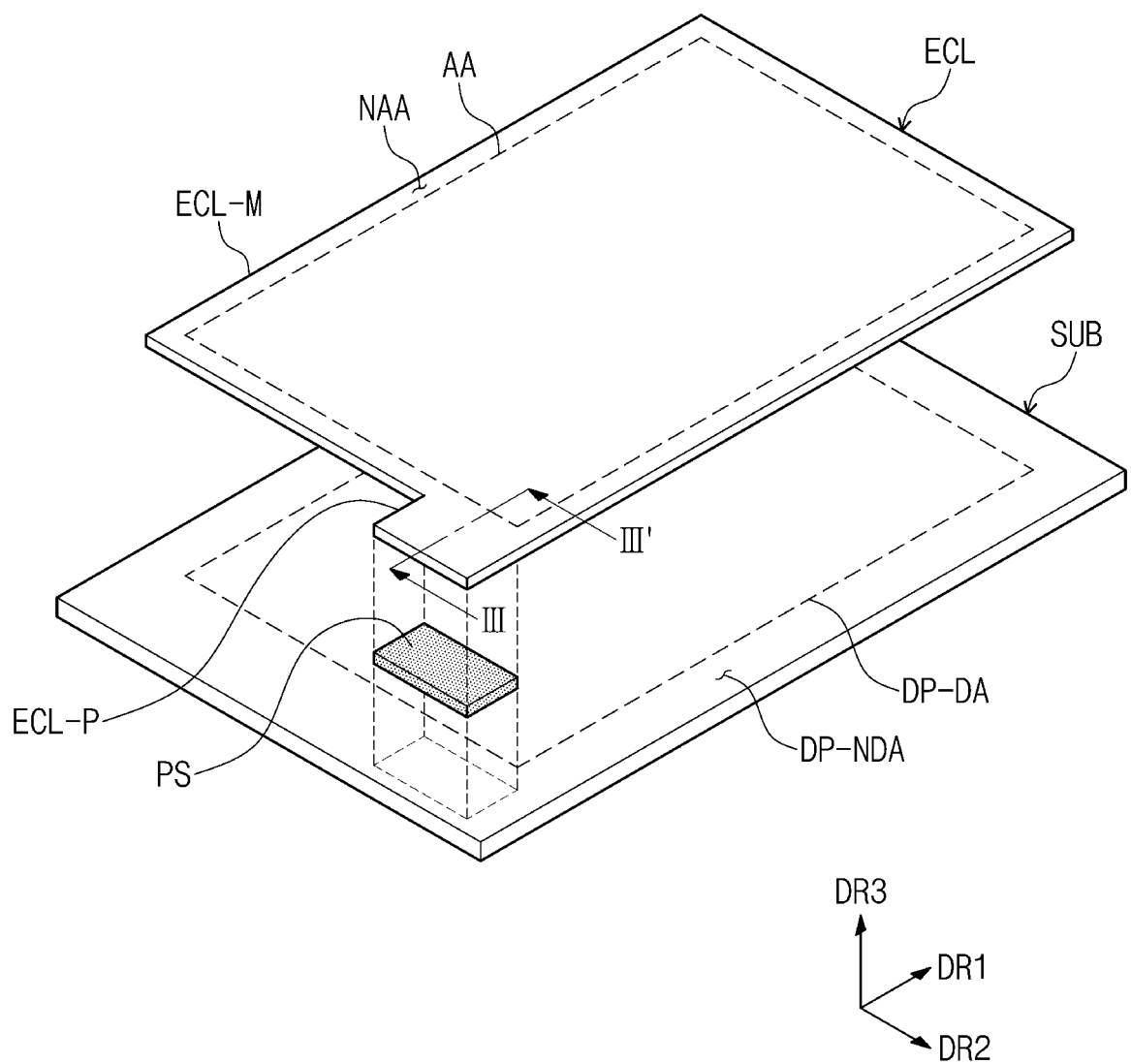
FIG. 7A is an exploded perspective view of a display module according to an example embodiment of the inventive concept.
Figure 7B:
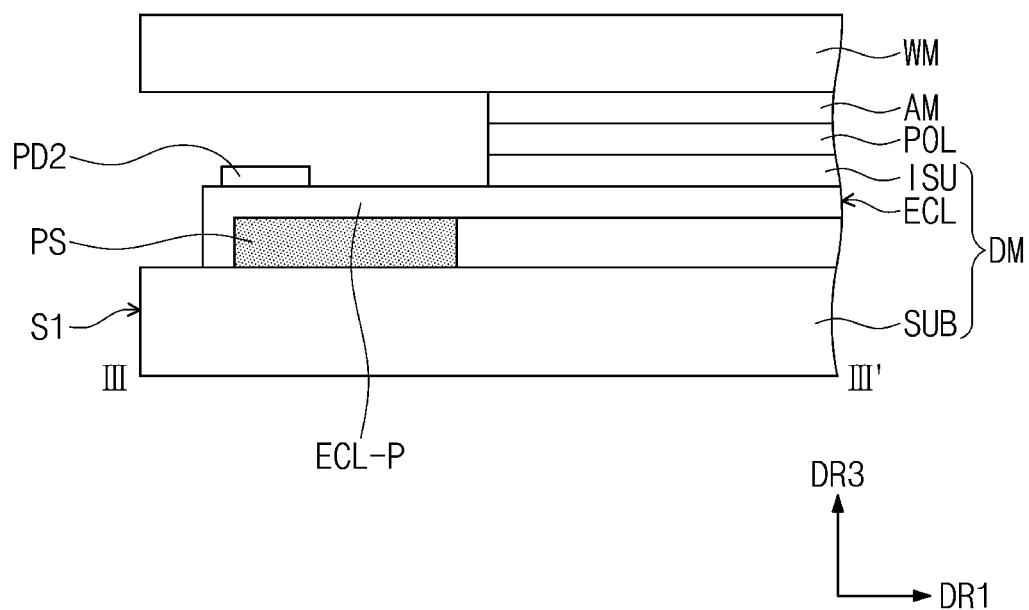
FIG. 7B is a cross-sectional view taken along line III-III' illustrated in FIG. 7A.

FIG. 7A is an exploded perspective view of a display module according to an embodiment of the inventive concept. FIG. 7B is a cross-sectional view taken along line III-III' illustrated in FIG. 7A.

Referring to FIG. 7A and FIG. 7B, the reinforcing member PS may be located between the protruding part ECL-P of the encapsulation layer ECL and the substrate SUB. That is, the reinforcing member PS may fill the gap between the protruding part ECL-P and the substrate SUB.

According to the present embodiment, the reinforcing member PS may include a resin, and in an example, may be provided in the form of silicone. However, a material for the reinforcing member PS is not particularly limited, and in an example, any material such as a metal or the like will be used as a material for the reinforcing member so long as the material can support the protruding part ECL-P. Also, the reinforcing member PS may be provided in the form of a tape. In an example, the tape may be provided as a double-sided tape.

In addition, according to the present embodiment, at least a portion of the reinforcing member PS may overlap the second circuit board PB2.

As described above, the embodiments have been disclosed in the drawings and specification. Although specific terms have been used herein, the terms are used only for purposes of description and are not intended to limit the meaning or the scope of the inventive concept disclosed in the claims. Therefore, it will be understood by those skilled in the art that various modifications and other equivalent embodiments are possible. Thus, the real protective scope of the inventive concept shall be determined by the technical scope of the accompanying claims, and equivalents thereof.

What is claimed is:

1. A display device comprising:
    a substrate comprising an upper surface, a lower surface, and side surfaces connecting the upper surface with the lower surface, wherein a display area and a bezel area adjacent to the display area are defined in the substrate;
    a display element layer on the upper surface of the substrate, the display element layer overlapping the display area;
    an encapsulation layer covering the display element layer, the encapsulation layer being located on the upper surface and comprising a main part being overlapping the display element layer, and a protruding part protruding along a first direction from the main part and overlapping the bezel area;

an input sensor on the main part;

a first circuit board facing the main part in the first direction, the first circuit board being further overlapping the bezel area and being located on the upper surface; and a second circuit board on the protruding part, wherein each of the first circuit board and the second circuit board is adjacent to a first side surface among the side surfaces, and wherein in the first direction, the protruding part is more adjacent to the first side surface than the main part.

2. The display device of claim 1, further comprising a polarizer overlapping the main part, the polarizer being on the input sensor.

3. The display device of claim 2, wherein a distance in the first direction between the first circuit board and the polarizer is the same as a distance in the first direction between the second circuit board and the polarizer, in a plan view of the substrate.

4. The display device of claim 2, further comprising:
a first pad portion between the first circuit board and the substrate, the first pad portion being electrically bonded to the first circuit board; and
a second pad portion on the protruding part, the second pad portion being electrically bonded to the second circuit board.

5. The display device of claim 4, wherein the first circuit board is electrically connected to the display element layer through the first pad portion, and the second circuit board is electrically connected to the input sensor through the second pad portion.

6. The display device of claim 1, wherein a distance in the first direction between the first side surface and the main part is longer than a distance in the first direction between the first side surface and the protruding part.

7. The display device of claim 1, further comprising:
a polarizer on the encapsulation layer; and
an adhesive between the polarizer and the input sensor.

8. The display device of claim 1, wherein the main part comprises a first part overlapping the display area, and a second part adjacent to the first part, the second part overlapping the bezel area, and
wherein the protruding part protrudes along the first direction from the second part.

9. The display device of claim 8, wherein in a plan view of the encapsulation layer, one end of a second pad portion adjacent to the first side surface is parallel to a second direction crossing the first direction.

10. The display device of claim 8, wherein in a plan view of the substrate, the first circuit board and the second circuit board do not overlap with each other.

11. The display device of claim 1, wherein in a plan view of the substrate, the protruding part does not overlap the first circuit board.

12. The display device of claim 1, further comprising a reinforcing member between the protruding part and the substrate.

13. The display device of claim 12, wherein in a plan view of the substrate, at least a portion of the reinforcing member overlaps the second circuit board.

14. A display module comprising:
a substrate comprising an upper surface, a lower surface, and side surfaces connecting the upper surface with the lower surface, wherein a display area and a bezel area adjacent to the display area are defined in the substrate;
a display element layer on the upper surface of the substrate, the display element layer overlapping the display area;
an encapsulation layer covering the display element layer, the encapsulation layer being located on the upper surface and comprising a main part being overlapping the display element layer and a protruding part protruding along a first direction from the main part and overlapping the bezel area;
an input sensor on the main part; and
a first pad portion overlapping the bezel area, the first pad portion being located on the upper surface,
wherein in the first direction, the protruding part is more adjacent to a first side surface among the side surfaces than the main part, and
wherein the first pad portion is adjacent to the first side surface.

15. The display module of claim 14, further comprising:
a second pad portion on the protruding part,
wherein the second pad portion is adjacent to the first side surface.

16. The display module of claim 15, wherein the first pad portion is electrically connected to the display element layer, and the second pad portion is electrically connected to the input sensor.

17. The display module of claim 15, further comprising a polarizer on the input sensor,
wherein in the first direction, a distance between the first pad portion and the polarizer is longer than a distance between the second pad portion and the polarizer.

18. The display module of claim 15, further comprising a polarizer on the encapsulation layer.

19. The display module of claim 18, further comprising an adhesive between the polarizer and the input sensor.

20. The display module of claim 14, wherein the main part is integrally connected with the protruding part.

* * * * *